United States Patent
Kautzsch et al.

(10) Patent No.: US 9,452,923 B2
(45) Date of Patent: Sep. 27, 2016

(54) METHOD FOR MANUFACTURING A MICROMECHANICAL SYSTEM COMPRISING A REMOVAL OF SACRIFICIAL MATERIAL THROUGH A HOLE IN A MARGIN REGION

(71) Applicant: Infineon Technologies Dresden GmbH, Dresden (DE)

(72) Inventors: Thoralf Kautzsch, Dresden (DE); Heiko Froehlich, Radebeul (DE); Mirko Vogt, Dresden (DE); Maik Stegemann, Pesterwitz (DE)

(73) Assignee: INFINEON TECHNOLOGIES DRESDEN GMBH, Dresden (DE)

( * ) Notice: Subject to any disclaimer, the term of this patent is extended or adjusted under 35 U.S.C. 154(b) by 546 days.

(21) Appl. No.: 13/722,248

(22) Filed: Dec. 20, 2012

(65) Prior Publication Data
US 2014/0175571 A1 Jun. 26, 2014

(51) Int. Cl.
H01L 41/00 (2013.01)
B81C 1/00 (2006.01)
H01L 41/09 (2006.01)

(52) U.S. Cl.
CPC ....... B81C 1/00158 (2013.01); B81C 1/00476 (2013.01); H01L 41/0933 (2013.01); B81C 2203/0145 (2013.01)

(58) Field of Classification Search
CPC . H01L 24/72; H01L 21/00; H01L 27/14687; H01L 27/14601
USPC ............... 257/417–419; 438/53; 73/715–731
See application file for complete search history.

(56) References Cited

U.S. PATENT DOCUMENTS

| | | | | |
|---|---|---|---|---|
| 5,242,863 A | * | 9/1993 | Xiang-Zheng | G01L 9/0042 148/DIG. 128 |
| 5,914,507 A | * | 6/1999 | Polla et al. | 257/254 |
| 5,919,548 A | * | 7/1999 | Barron | B81C 1/00611 428/138 |
| 6,012,336 A | * | 1/2000 | Eaton | B81C 1/00246 73/754 |
| 6,413,793 B1 | * | 7/2002 | Lin et al. | 438/50 |
| 7,859,740 B2 | * | 12/2010 | Tung | 359/291 |
| 8,008,105 B2 | * | 8/2011 | Huang | 438/52 |
| 2009/0108381 A1 | * | 4/2009 | Buchwalter | B81C 1/0023 257/415 |
| 2009/0152980 A1 | * | 6/2009 | Huang | 310/309 |
| 2009/0160061 A1 | * | 6/2009 | Hsu et al. | 257/763 |
| 2012/0013020 A1 | * | 1/2012 | Guo et al. | 257/774 |
| 2012/0161257 A1 | * | 6/2012 | Friza et al. | 257/416 |
| 2012/0205653 A1 | * | 8/2012 | Nishikage | G01L 9/0045 257/49 |

* cited by examiner

*Primary Examiner* — Benjamin Sandvik
(74) *Attorney, Agent, or Firm* — Eschweiler & Associates, LLC

(57) ABSTRACT

A method for manufacturing a micromechanical system includes creating a sacrificial layer at a substrate surface. A structural material is deposited at a sacrificial layer surface and at a support structure for later supporting the structural material. At least one hole is created in the structural material extending from an exposed surface of the structural material to the surface of the sacrificial layer. The at least one hole leads to a margin region of the sacrificial layer. The sacrificial layer is removed using a removal process through the at least one hole, to obtain a cavity between the surface of the substrate and the structural material. The method also includes filling the at least one hole and a portion of the cavity beneath the at least one hole close to the cavity. A corresponding micromechanical system and a microelectromechanical transducer are also described.

21 Claims, 11 Drawing Sheets

FIG 10 ness of the embodiment of the present disclosure.

METHOD FOR MANUFACTURING A MICROMECHANICAL SYSTEM COMPRISING A REMOVAL OF SACRIFICIAL MATERIAL THROUGH A HOLE IN A MARGIN REGION

FIELD

Embodiments of the present disclosure relate to a method for manufacturing a micromechanical system. Further embodiments of the present disclosure relate to a micromechanical system. Further embodiments of the present disclosure relate to a microelectromechanical transducer. Further embodiments of the present disclosure relate to integration variants for horizontal pressure sensor structures.

BACKGROUND

The term "microelectromechanical systems" (MEMS) is often used to refer to small integrated devices or systems that combine electrical and mechanical components. When focusing on the micromechanical parts, the term "micromechanical system" may be used to describe small integrated devices or systems which comprise one or more micromechanical elements and possibly, but not necessarily, electrical components and/or electronic components.

Microelectromechanical systems and micromechanical systems may be used as, for example, actuators, transducers or sensors, e.g., pressure sensors. Pressure sensors are nowadays mass products in automobile electronics and consumer goods electronics. For many of these applications, systems are being used in which the sensor is integrated in an application-specific integrated circuit (ASIC). For example, Infineon Technologies AG offers such a system as a side-airbag sensor.

In particular the mechanically active elements of a micro (electro)mechanical system may typically require relatively complex structures, such as recesses, beams, cantilevers, undercuts, cavities etc. Possibly, a relatively high number of manufacturing steps are needed. Furthermore, the process used for performing the micromechanical system may need to be compatible with possible subsequent manufacturing steps that are used for creating electrical and/or electronic components, for example.

SUMMARY

A method for manufacturing a micromechanical system comprises a removal of sacrificial material through a hole in a margin region.

Embodiments of the present disclosure relate to a method for manufacturing a micromechanical system. The method comprises creating a sacrificial layer at a surface of a substrate and depositing a structural material at a surface of the sacrificial layer and at a support structure. The support structure is provided for later supporting the structural material. The method also comprises creating at least one hole in the structural material. The at least one hole extends from an exposed surface of the structural material to the surface of the sacrificial layer and leads to a margin region of the sacrificial layer. Furthermore, the method comprises removing the sacrificial layer using a removal process. The removal process is performed or acts through the at least one hole. In this manner, a cavity between the surface of the substrate and the structural material is obtained. The method also comprises filling the at least one hole and a portion of the cavity beneath the at least one hole close to the cavity.

Further embodiments of the present disclosure relate to a method for manufacturing a micromechanical system. The method comprises forming a shallow trench within a substrate and creating at least one of an oxide layer and a nitride layer as an isolation within the shallow trench. The method further comprises doping at least a portion of the substrate within the shallow trench. The method also comprises depositing and structuring a sacrificial layer in the shallow trench and depositing a structural material within the shallow trench. Furthermore, the method comprises structuring the structural material and concurrently forming at least one hole in the structural material that is adjacent to a lateral edge of the sacrificial material. The at least one hole gives access to the sacrificial layer. The method comprises removing the sacrificial layer by etching the sacrificial layer through the at least one hole that is formed in the structural layer. The at least one hole is then closed and concurrently a relatively small portion of the cavity beneath the at least one hole is also filled with a material that is used for closing the at least one hole. A major portion of the cavity is maintained as the at least one hole is adjacent to the margin region of the cavity.

Further embodiments of the present disclosure relate to a micromechanical system comprising a substrate, a structural material, a cavity between the substrate and the structural material, and a filled hole. The filled hole extends through the structural material in a direction perpendicular to a main surface of the substrate at a lateral position just outside the cavity. The filled hole is filled with a first material. The micromechanical system further comprises a pillar of the first material extending between the filled hole and the substrate. The pillar is adjacent to the cavity.

Further embodiments of the present disclosure relate to a microelectromechanical transducer comprising a substrate, a cavity formed within the substrate and bounded by a bottom and a sidewall, and a support structure mechanically connected to the substrate or being a part of the substrate. The microelectromechanical transducer further comprises a mechanical transducer component that is supported by the support structure and has a deflectable portion extending over at least a portion of the cavity. A filled hole filled with a first material extends through the mechanical transducer component at a transition from the deflectable portion to a remaining portion of the mechanical transducer component. The microelectromechanical transducer further comprises a plug of the first material adjacent to the filled hole at a cavity-side end of the filled hole. The plug is in contact with at least one of the bottom and the sidewall of the cavity.

BRIEF DESCRIPTION OF THE DRAWINGS

Embodiments of the present disclosure will be described in more detail using the accompanying figures in which.

DETAILED DESCRIPTION

Before embodiments of the present disclosure will be described in detail using the accompanying figures, it is to be pointed out that the same or functionally equal elements are given the same reference numbers or similar reference numbers in the figures and that a repeated description for elements provided with the same or similar reference numbers is typically omitted. Hence, descriptions provided for elements having the same or similar reference numbers are mutually exchangeable.

Pressure sensors and other sensors are nowadays mass products of automobile electronics and consumer goods electronics. Sometimes the sensor or several sensors are integrated as a system in the form of, for example, an application specific integrated circuit (ASIC). When migrating towards new technology nodes, one of the challenges is to integrate these systems in such a manner that the complexity of, for example, a CMOS (Complementary Metal Oxide Semiconductor) process is not unnecessarily increased and that the existing integration scheme of the CMOS circuit can be preserved to a high extent, preferably with little or minimal development effort.

In the context of technologies with structure widths of 130 nm and below, for example the topology of the front-end-of-line structures plays a relatively important role. It may be desired that a total thickness must not exceed a few hundred nanometers, in order not to impair a BPSG (borophosphosilicate glass) polishing step which is often present. Furthermore, a reduction for as few as possible intermediate steps and the sharing or joint use of existing processes may facilitate a successful integration, or even constitute a prerequisite for a successful integration.

With respect to pressure sensors, one option is provided by integrated pressure sensor structures that use a polycrystalline silicon blade or membrane which is formed on the substrate. The used process employs 5 to 6 mask layers and an elaborate process for removing a sacrificial layer between the blade and the substrate. In this form, the process is typically not integratable with a CMOS process. Other suggestions relate to a blade or membrane that is integrated within the substrate. These suggestions have not or only to a minor extent been studied in connection with an integration into a 130 nm node.

At least one of the proposed variants integrates the pressure blade or membrane into a trench for shallow trench isolation (STI) and reduces the number of structuring lithography processes. Depending on the process control it is furthermore possible to employ a STI-HDP oxide (Shallow Trench Isolation—High Density Plasma oxide) as a plug or seal for the hole(s) that has/have been used for clearing out the sacrificial layer. In this manner, a maximal use of given processes within the CMOS flow may be achieved.

To this end, the opening of the membrane may be performed at the corner(s) or the margin of the sacrificial material 42 or the eventual cavity. Hence, the lithography process for structuring the polycrystalline blade can be used, in a joint manner, for hole etching. Furthermore it is possible to use a process for closing, filling, or plugging, which does not necessarily have to preserve a portion of the cavity (directly) under the hole within the blade.

Figure 1:
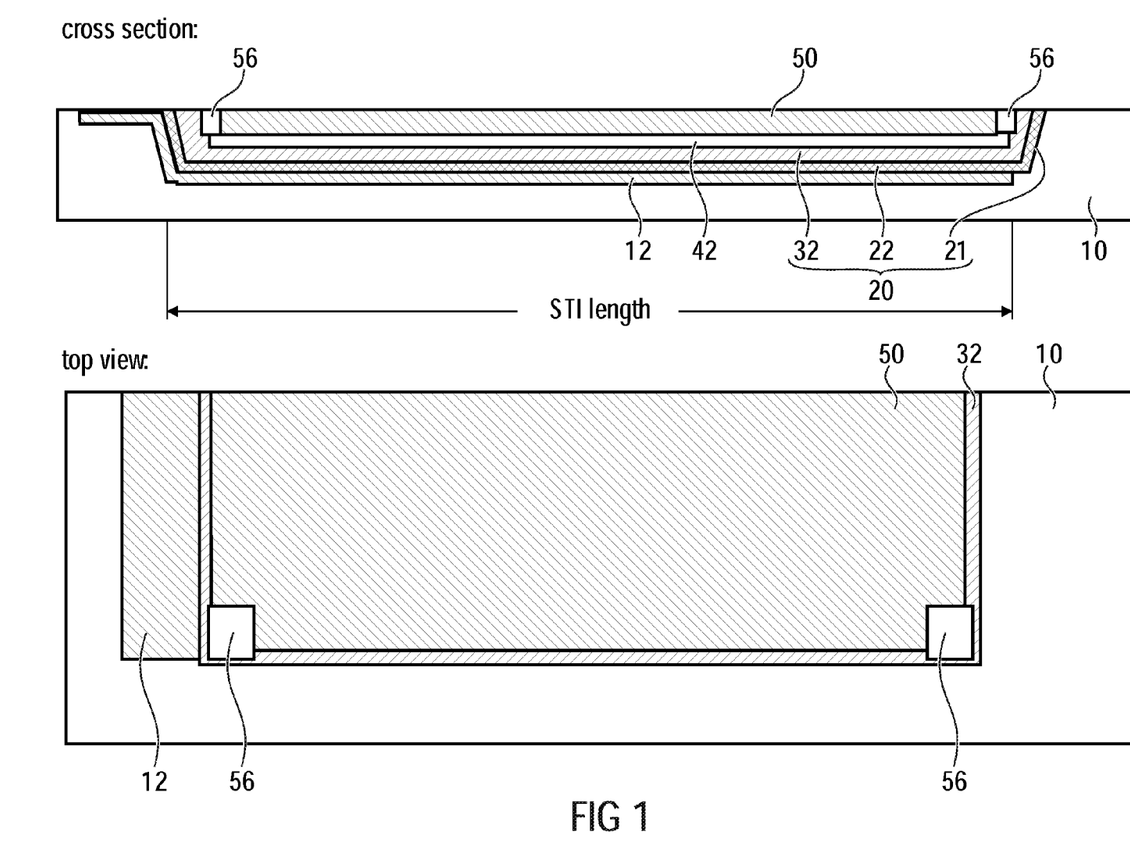
FIG. 1 shows a schematic cross-section and a schematic top view of an integrated pressure sensor structure obtained using a method for manufacturing a micromechanical system as described herein.

FIG. 1 shows a schematic cross-section and a schematic top view of a micromechanical system. In particular, the upper part of FIG. 1 shows a schematic cross-section of the basic structure of a micromechanical system. The lower part of FIG. 1 shows a schematic view from above (section through the sensor center) of the micromechanical system. The micromechanical system (which may also be a microelectromechanical system, or MEMS) shown in FIG. 1 comprises a substrate 10 in which a STI structure 20 is formed. The STI structure 20 comprises a trench (represented by its original sidewall 21, now an interface between the substrate 10 and oxide layer 22), said oxide layer 22, and a nitride layer 32. The STI structure shown in FIG. 1 is an example, only. Other STI structures may have, for example, a different layering (e.g., the oxide layer 22 or the nitride layer 32 may be omitted or their positions may be reversed).

To give an idea of the size of the STI structure 20, it is indicated that the STI length of a micromechanical system may be between, for example, 12 µm and 20 µm in one embodiment. Other values are also possible. When viewed from above, the STI structure may be rectangular, quadratic, square, circular, or oval. Other shapes are also possible. In the top view shown in the lower part of FIG. 1, only a portion of the micromechanical system and the STI structure is shown.

In addition to the STI structure 20, the micromechanical system further comprises a n-doped well 12 and a polycrystalline silicon blade or membrane 50. The n-doped well 12 is situated between the oxide layer 22 and the (remaining) substrate 10. As illustrated in FIG. 1, a left end of the n-doped well 12 extends to a surface of the substrate 10 in order to provide a contact surface for connecting an electrical circuit to the n-doped well 12. The n-doped well 12 may function as a counter electrode for the micromechanical system or the microelectromechanical system.

The polycrystalline silicon blade or membrane 50 has approximately the size of the STI area less approximately 0.5 µm per edge. The value of 0.5 µm is cited as an example only and may in the alternative range from, for example, 0.2 µm to 2 micrometers, with intermediate values spaced 0.1 µm from each other.

FIG. 1 actually illustrates the micromechanical system at an intermediate stage of a manufacturing process at which a sacrificial material 42 is still present between the nitride layer 32 and the blade or membrane 50, i.e., the structural material. In order to remove the sacrificial material 42, access must be provided to the sacrificial layer 42 so that an etching agent may be supplied to the sacrificial material 42 and/or residual products may leave a cavity that is being created by removing the sacrificial material 42. This access to the sacrificial material 42 is made possible by one or more holes 56. The one or more holes are arranged adjacent or close to an edge of the blade/membrane 50. In other words, the hole(s) 56 extend(s) from an exposed surface (i.e., the "upper" surface in the representation of FIG. 1) of the structural material 50 to a surface of the sacrificial layer 42. The at least one hole 56 leads from the exposed surface to a margin region of the sacrificial layer 42. As illustrated in FIG. 1, the holes 56 may be located in the corners of the structural material 50. Depending on the configuration of the manufacturing process, it may be possible that the holes 56 do not require a dedicated mask, but can be structured concurrently with other structures using the same mask. The at least one hole 56 may have a lateral extension ranging from, for example, 200 nm to 2 µm with intermediate values being spaced 100 nm from each other. For example, the at least one hole 56 may have a lateral extension of 500 nm. In particular, the at least one hole 56 may be square with a size of 500 nm×500 nm, for example. Once the sacrificial layer 42 has been removed and a cavity between the structural material or the membrane 50 and the nitride layer 32 has been obtained, the at least one hole 56 may be obstructed or plugged, thus leaving at least one filled hole. The at least one hole 56 may be filled with, for example, an oxide, in particular a high density plasma (HDP) oxide. The filling material for the at least one hole 56 is also referred to as "first material" in some parts of this description.

The sacrificial layer 42 may comprise carbon or may be a carbon sacrificial layer. Its size may be estimated as the size of the STI less 300 nm per edge in one embodiment (other values ranging from, for example, 150 nm to 3 µm being spaced 100 nm from each other are also possible).

The removal of the sacrificial layer 42 is supported by the use of a material that exhibits an extreme selectivity regarding the etch rate to the etch velocities of the surrounding materials. In this manner, the complete sacrificial layer 42 can be cleared out even from remote points. Furthermore, only dry etching processes are necessary so that problems such as sticking during the process are not to be expected.

The choice of the corners as opening points allows a high degree of freedom when closing the openings or holes 56. Since the corners only play a minor role with respect to the membrane's mechanical properties and displacement under forces acting in orthogonal direction to the membrane, maintaining the cavity (immediately) under the closing oxide is not absolutely mandatory (i.e., maintaining the cavity portion directly under the filled hole and in the vicinity). For this reason, it may even be possible to use the STI-HDP process in a joint manner, in case a suitable process flow is implemented.

Figure 2:
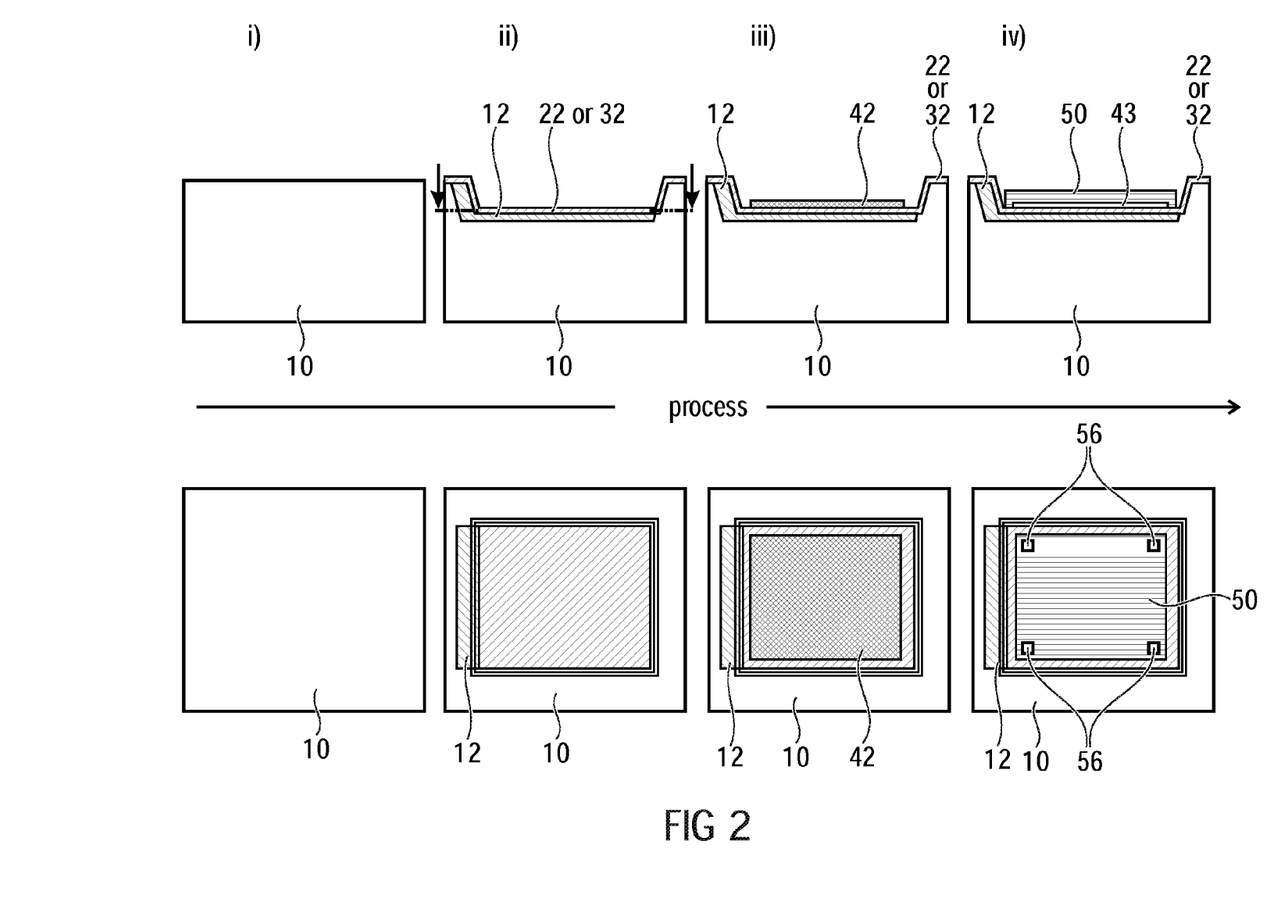
FIG. 2 shows a basic process flow of a method for manufacturing a micromechanical system in schematic cross-sectional views and schematic top views.

FIG. 2 schematically illustrates four stages of a process for manufacturing a micromechanical system. For each stage, a schematic cross-section and a schematic top view of the micromechanical system is shown. The upper row in FIG. 2 illustrates the schematic cross sections and the lower row illustrates the schematic top views of the micromechanical system at the various process steps. In particular, FIG. 2 relates to a laterally integrated pressure sensor and schematically illustrates a process flow which may be used to manufacture such a laterally integrated pressure sensor.

The basic process flow may comprise the following process modules:
  Shallow trench structuring (including lithography, etching, cleaning steps)
  Isolation (oxide layer, nitride layer) and substrate doping
  Sacrificial layer deposition and structuring
  Counter electrode deposition (i.e. poly silicon (polycrystalline silicon)) and structuring
  Sacrificial layer removal and etch hole closure
  Wiring Step i) in FIG. 2 shows a bare wafer which provides the substrate 10 for the micromechanical system. The wafer is typically of a semiconductor material, such as silicon, germanium, GaAs, etc. and typically a highly pure monocrystal of any one of these materials or other suitable semiconductor materials.

Step ii) schematically illustrates the substrate 10 after a shallow trench has been formed at an upper main surface of the substrate 10. In particular, the shallow trench may be formed substantially concurrently with a corresponding step of a shallow trench isolation (STI) process. Furthermore, an electrical isolation may be performed at a bottom and the sidewalls of the shallow trench, as indicated by the oxide layer 22 or the nitride layer 32. According to some embodiments, both the oxide layer 22 and the nitride layer 32 may be provided. The layers 22 and/or 32 may be formed using a thermal oxidation process and/or a deposition process, e.g., CVD. Note that the layer 22 or 32 is not illustrated in the top views in the lower row of figures to provide a clear view of other components of the micromechanical system.

Step ii) of FIG. 2 also schematically illustrates a relatively highly doped well 12 which is located adjacent to a bottom surface of the isolation layer 22 or 32 and also extends to the surface of the substrate 10 along one of the sidewalls of the rectangular shallow trench. Typically, the well 12 has the same doping type as the substrate 10, however at a higher doping concentration so that the well 12 has a higher electrical conductivity than the (remaining) substrate 10. For example, both the substrate 10 and the well 12 may be n-doped, and the doping level of the well 12 may be 2 to 5 orders of magnitude higher than the doping level of the substrate 10. The high doping concentration of the well 12 may be created by means of an ion implantation process or a diffusion process, followed by furnace anneal or rapid thermal anneal (RTA). The well 12 may be used as a (counter) electrode in a finished microelectromechanical system or microelectromechanical transducer.

Step iii) schematically shows a cross-section and a top view of the micromechanical system after the sacrificial layer 42 has been deposited and structured. As can be seen in the top view of the micromechanical system in the lower row of pictures, the sacrificial layer 42 has been structured in a rectangular manner covering a major portion of a bottom of the shallow trench. The sacrificial layer 42 has been deposited at a surface of the oxide/nitride layer 22 or 32. The sacrificial layer 42 does not extend all the way to the sidewalls of the oxide/nitride layer 22 or 32, but leaves a frame-like region surrounding the sacrificial layer 42, as can be seen in the schematic top view of step iii).

Step iv) of FIG. 2 schematically shows the micromechanical system or microelectromechanical system after the counter electrode 50 has been deposited and structured. Furthermore, the sacrificial layer 42 has been etched, leaving a cavity 43 between counter electrode (blade or membrane) 50 and the isolation layer 22; 32. The sacrificial layer 42 has been etched by a removal process which accesses the sacrificial layer 42 via at least one hole (here: four holes 56 near four corners of the counter electrode or membrane 50). The etch hole closure is then performed in order to fill the etch holes 56 (squares in the schematic top view of step iv)). Although not shown in the schematic cross-sectional view of step iv), filling the etch holes 56 may cause a material used for filling the etch holes 56 to also flow into the cavity 43. The holes 56 are located in a margin region of the sacrificial layer 42 and hence also of the cavity 43. This means that one of the openings of each etch hole 56 is located within this margin region of the sacrificial layer 42 and the cavity 43. Due to this arrangement of the etch holes 56 in the margin region of the sacrificial layer 42 and/or the cavity 43, a clear width of the cavity 43 is not substantially affected by the filling material (first material) used for filling the etch holes 56, even if a certain amount of this filling material flows into the cavity 43. Moreover, the filling material may be prone to adhere to the sidewalls of the shallow trench, in particular the oxide/nitride layer 22 or 32. Such adhesion may support the formation of a pillar-like structure extending from the bottom of the oxide/nitride layer 22; 32 to the etch hole 56 at hand. Accordingly, the hole filling material (also referred to as "first material" in other parts of the description) does not extend very far in a lateral direction into the cavity 43, but remains within or at least close to the margin region.

The minimum number of the lithographic layers for obtaining a sensor device as illustrated in FIG. 2 may typically be three: a first layer for the STI process, a second layer for the sacrificial layer 42, and a third layer for the counter electrode 50.

Figure 3:
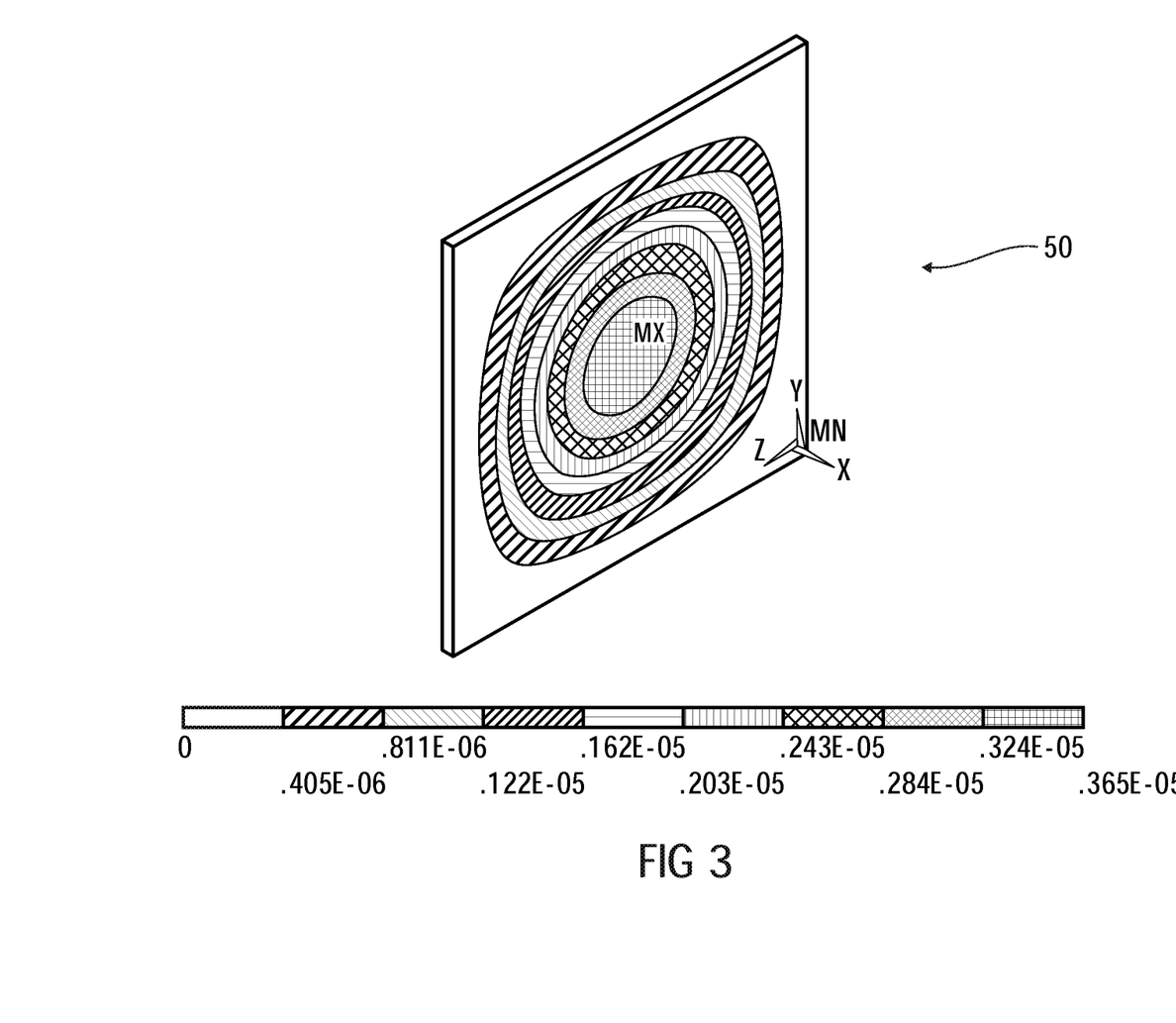
FIG. 3 schematically illustrates the results of a numerical simulation of the displacement of a membrane with a pressure of 1 bar acting on it.

FIG. 3 shows the result of a finite element method (FEM) simulation of a membrane 50 that is exposed to a pressure of 1 bar. For the sake of simulation, the membrane 50 was assumed to be 300 nm thick and clamped at all four sides. As may be expected, the maximal displacement (3.65 nm) can be observed in the middle of the membrane 50. On the other hand, the distance of the equidistance surfaces to the membrane edge makes it clear that in the corners of the membrane the smallest displacement is to be expected.

The preceding description of FIGS. 1 to 3 suggests a simplified removal of the sacrificial layer 42 under, for example, a pressure sensor membrane 50 which is made possible by an appropriate selection/placement of the opening points for clearing out the sacrificial layer 42. In this manner and under certain further circumstances it may be possible to use existing process sequences for a CMOS process (STI filling oxide) in a joint manner. This arrangement is supported by the use of a highly selective, dry-etchable material. Furthermore, the selection of the placement (STI trench) may also be significant for integratability of the suggested process for manufacturing a micromechanical system into an existing CMOS process.

Figure 4:
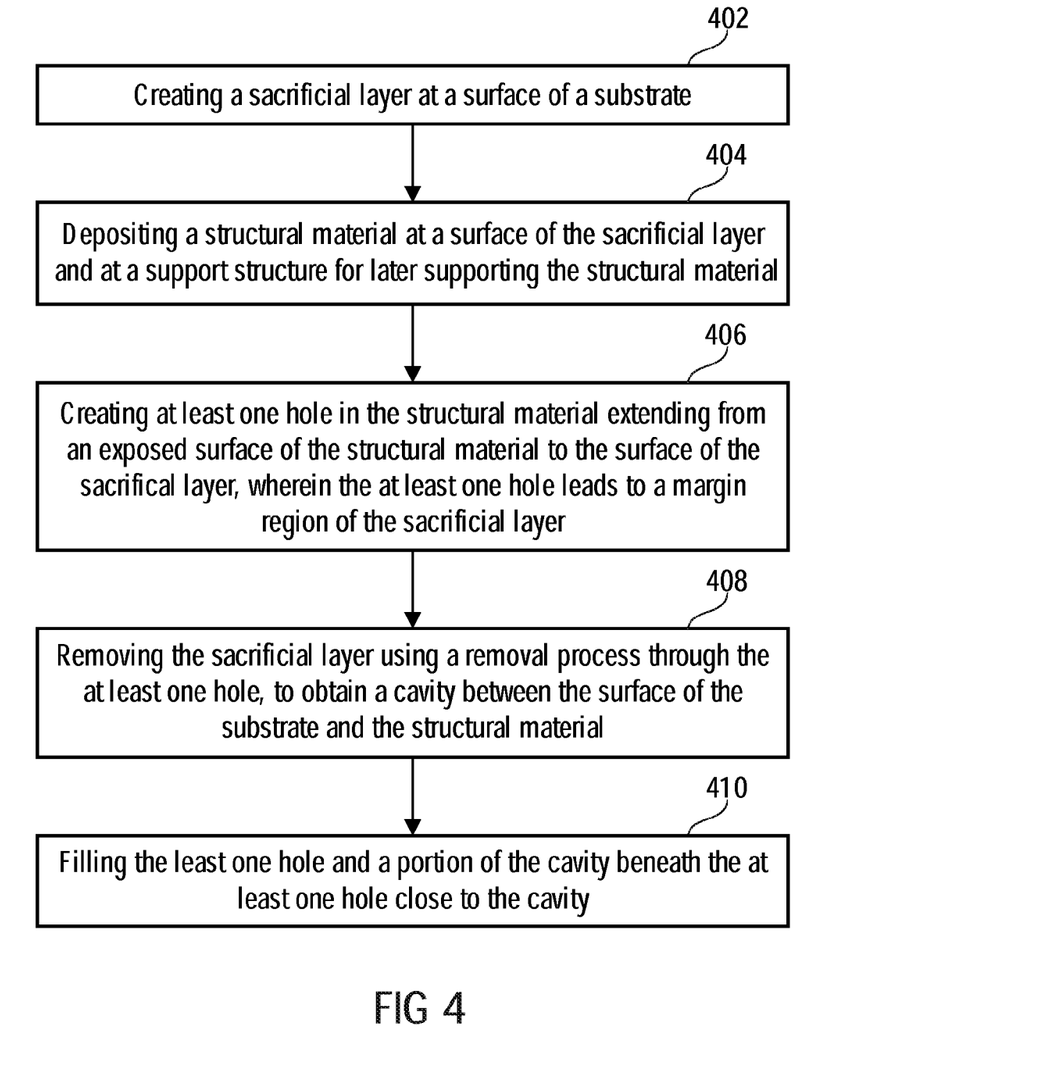
FIG. 4 shows a schematic flow diagram of a method for manufacturing a micromechanical system.

FIG. 4 shows a schematic flow diagram of a method for manufacturing a micromechanical system. The method comprises a step 402 of creating a sacrificial layer at a surface of a substrate at 402. The sacrificial layer may comprise carbon or be a carbon layer. The sacrificial layer may be deposited at the surface of the substrate by means of, for example, a chemical vapor deposition (CVD) process, an ion deposition process, an ion-assisted sputtering, a sputtering process, a cathodic vacuum arc process, a plasma deposition process, and/or a pulsed laser deposition. Furthermore, creating the sacrificial layer at 402 may also comprise or be succeeded by a structuring of the sacrificial layer by means of, for example, a lithography step. A lateral boundary may be defined to laterally delimit the sacrificial material so that it covers a certain portion of the surface of the substrate and a remaining portion of the surface of the substrate is exposed or at least not covered by the sacrificial layer. The sacrificial material may also be structured to have a lateral shape with at least one vertex or corner.

The method further comprises an act 404 during which a structural material is deposited at a surface of the sacrificial layer. The structural material is also deposited at a support structure. The support structure is provided for later supporting the structural material once the sacrificial material will have been removed.

An act 406 of the method at least one hole is created in the structural material extending from an exposed surface of the structural material to the surface of the sacrificial layer. The at least one hole leads to a margin region of the sacrificial material. The at least one hole provides an access to the sacrificial layer which is needed during a subsequent process act 408.

The margin region of the sacrificial layer may be regarded as a region close to a lateral circumference of the sacrificial layer, compared to an overall lateral extension of the sacrificial layer. The width of the margin region may depend on the geometric structure and/or the micromechanical properties of the structural material. For example, the margin region may be relatively wide in an area near the corners of the sacrificial layer, and more narrow near the centers of the edges. Alternatively or additionally, the lateral cross sectional area of the at least one hole may be defined as being at most 5% of the lateral cross sectional area of the cavity, or alternatively at most 4% or 3% or 2% or 1%. From these optional definitions it becomes clear that a portion of the structural material that is adjacent to a central portion of the sacrificial layer (and an eventually created cavity after removal of the sacrificial layer) is free of holes, as these are (exclusively) located in the margin region. According to some embodiments the margin region may extend from the lateral boundary of the sacrificial material in a direction perpendicular to the lateral boundary by at most 30% of a largest lateral extension of the sacrificial layer.

In case the sacrificial layer has a lateral shape with at least one vertex, the at least one hole in the structural material may be created in an extension of a portion of the margin region that comprises the at least one vertex in one embodiment. The structural material is typically clamped in a relatively firm manner in the vicinity of such a vertex so that any mechanical properties of the structural material are only slightly (if at all) altered by providing the at least one hole in this region and subsequently filling this hole and also a portion of the cavity directly beneath the hole with a material as described in a subsequent act 410.

The method further comprises an act 408 of removing the sacrificial layer. To this end, a removal process is used which acts through the at least one hole. By means of the removal process a cavity between the surface of the substrate and the structural material is obtained. The removal process may be a wide-ranging process so that substantially the entire sacrificial layer can be removed by applying the removal process from the at least one hole that leads to the margin region of the sacrificial material. The removal process may comprise at least one of a thermal decomposition process, a dry etching process, and an ashing process.

The method for manufacturing the micromechanical system further comprises an act 410 of filling the at least one hole. At the same time, a portion of the cavity that is beneath the at least one hole is also filled with the same material. This portion of the cavity is typically filled due to a side effect of filling the at least one hole. As mentioned above, the at least one hole is adjacent to, or in an extension of, the margin region of the sacrificial layer and hence also adjacent (typically in a direction orthogonal to a surface of the substrate) to a margin region of the cavity. Nearby side walls and the bottom bounding of the cavity may lead to a locally confined deposition of the filling material within the cavity (e.g., due to adhesion effects) so that the portion of the cavity that is filled during the act 410 makes up only a small fraction of the entire cavity. Moreover, the filled cavity portion is within a margin portion of the cavity, i.e. close to a lateral boundary of the cavity, so that a clear width of the cavity is reduced only to a minor or negligible extent by the filled cavity portion. Filling the at least one hole may be performed using a shallow trench isolation high density plasma (STI-HDP).

The method may further comprise creating a trench within the substrate prior to creating the sacrificial layer, i.e., prior to act 402 of the flow diagram in FIG. 4. At least a portion of the sacrificial layer may then be created at the surface of the substrate within the trench. For example, the sacrificial layer may be created at a bottom of the trench or a portion thereof. The trench may be formed substantially concurrently with a corresponding trench forming act of a shallow trench isolation (STI) process that is performed on the substrate for isolating electronic components from each other, wherein these electronic components themselves are to be formed at or within the substrate at a later time.

In addition to the creation of a trench within the substrate prior to creating the sacrificial material, the method may also comprise: filling, at least partially, the trench with an oxide and/or nitride between the creation of the trench and the creation of the sacrificial material. The oxide and/or nitride may be deposited using CVD, or obtained using a thermal transformation process.

Furthermore, the method may comprise a CMOS process after filling the at least one hole. The CMOS process may be performed immediately after the act 410 or after one or more intermediary acts have been performed. For example, a surface polishing may be performed so that the subsequent CMOS process finds a surface having the required properties with respect to smoothness.

The structural material may eventually form one of a membrane, a beam, a lever, a cantilever, etc. of the micromechanical system once the micromechanical system is finished. The structural material thus becomes a mechanical transducing or mechanically active element. Because of the cavity that has been formed adjacent to the structural material, at least a portion of the structural material is able to move in response to a mechanical force, a pressure, an acceleration, an electrical force, and other physical influences.

Figure 5:
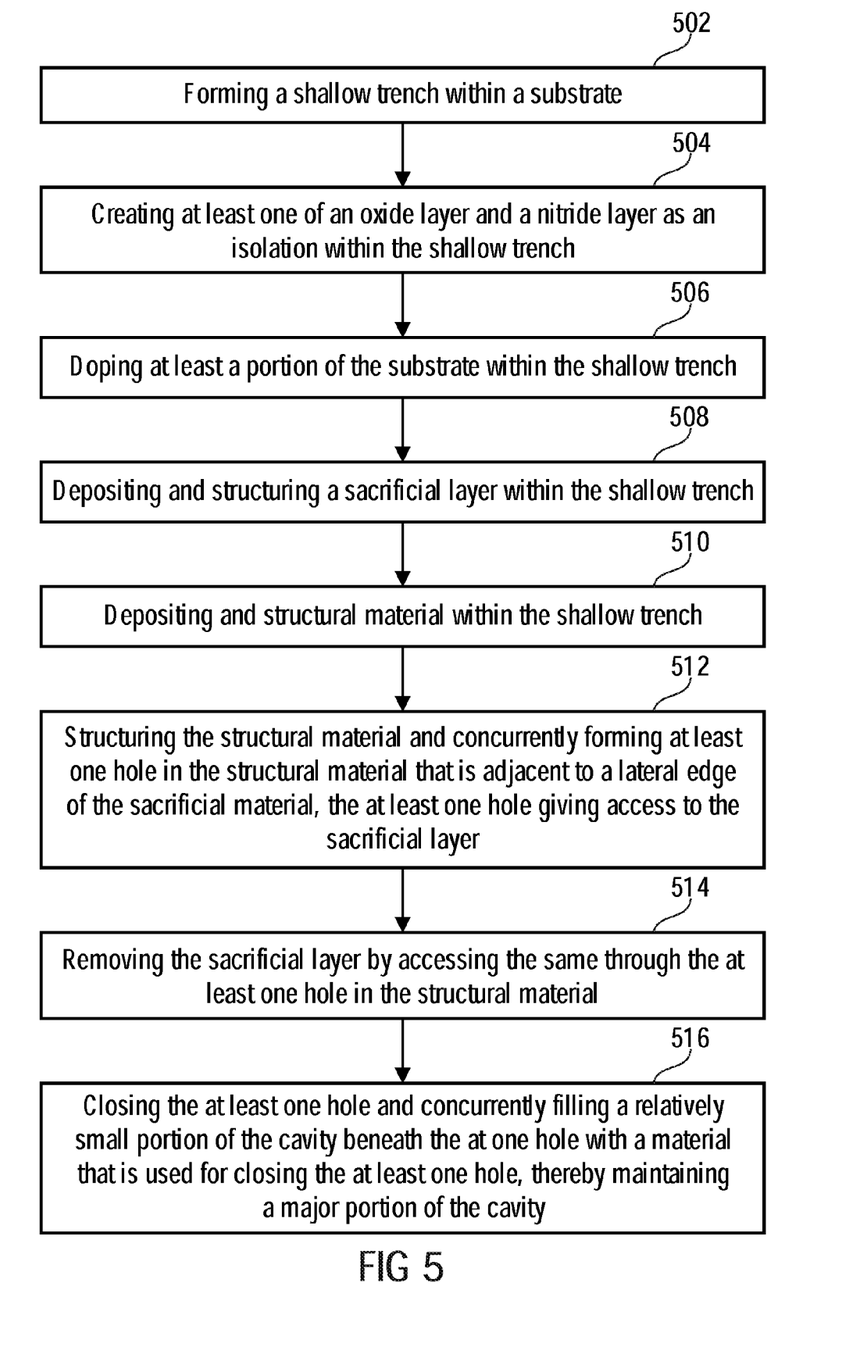
FIG. 5 shows a schematic flow diagram of a further method for manufacturing a micromechanical system.

FIG. 5 shows a schematic flow diagram of a further method for manufacturing a micromechanical system. The method comprises forming a shallow trench within a substrate at 502. Such shallow trench structuring may in particular comprise lithography, etching, and cleaning steps.

At 504, the method continues with the creation of at least one of an oxide layer and a nitride layer as an electrical isolation within the shallow trench.

At 506, at least a portion of the substrate within the shallow trench and possibly also laterally adjacent to the shallow trench is doped in order to modify an electrical conductivity of this portion of the substrate. For example, the substrate itself may be n-doped at a relatively low doping level and the doped portion of the substrate within the shallow trench or adjacent to a bottom of the shallow trench may be n-doped at a relatively high doping level.

The method further comprises depositing and structuring a sacrificial layer within the shallow trench at 508. Subsequently, a structural material is deposited within the shallow trench, as indicated at 510. The method further comprises structuring the structural material and concurrently forming at least one hole in the structural material that is adjacent to a lateral edge of the sacrificial material at 512. The at least one hole gives access to the sacrificial layer. The two acts 510 and 512 may also be regarded as a counter electrode deposition (e.g., poly silicon) and a corresponding structuring.

The sacrificial layer may then be removed at 514 by accessing the sacrificial layer through the at least one hole in the structural material. During an act 516 of the method the at least one hole is closed. Concurrently a relatively small portion of the cavity beneath the at least one hole is filled with a material that is also used for closing the at least one hole in the structural material. In this manner, a major portion of the cavity is maintained or preserved. A clear width of the cavity is only slightly reduced by the relatively small portion of the cavity which is filled concurrently with the hole closure. The acts 514 and 516 may also be described as sacrificial layer removal (act 514) and etch hole closure (act 516).

Figure 6A:
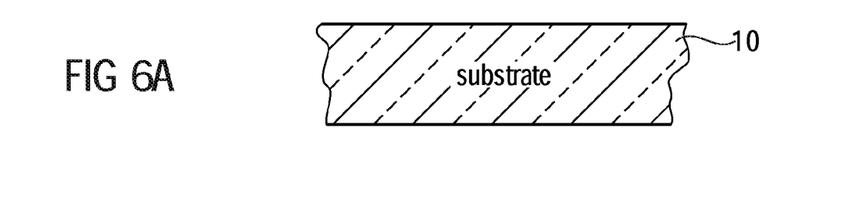
FIGS. 6A to 6G show schematic cross sections through a micromechanical system at several stages of a manufacturing process.
Figure 6B:
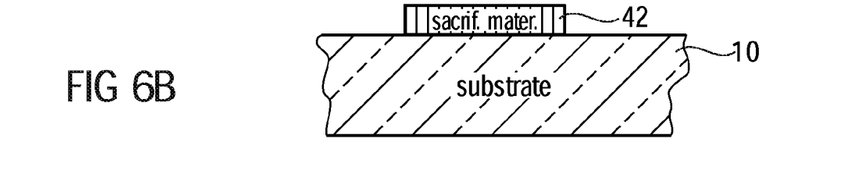

FIGS. 6A to 6G show schematic cross sections of a substrate and related structures to illustrate a manufacturing process for obtaining a micromechanical system. FIG. 6A shows the bare substrate 10. In FIG. 6B it can be seen that a sacrificial material or sacrificial layer 42 has been created at a surface of the substrate 10. The sacrificial layer 42 covers a portion of the surface of the substrate. This can be achieved by first depositing the sacrificial material and then structuring the sacrificial material according to a desired shape of a future cavity of a micromechanical system. The sacrificial material is used during the manufacturing process as a placeholder for the future cavity.

Figure 6C:
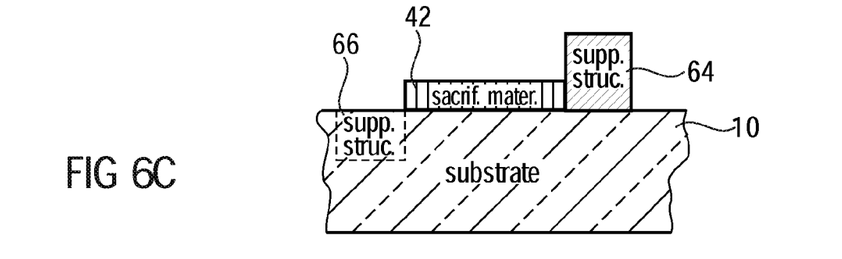

In FIG. 6C an optional act of creating a support structure 64, 66 is illustrated. In the illustrated example, the support structure comprises a first support structure portion 64 and a second support structure portion 66. The first support structure portion 64 comprises an elevated element which extends from the surface of the substrate 10 away from the substrate 10. The first support structure portion 64 is typically made of a material other than the sacrificial material of the sacrificial layer 42. The second support structure portion 66 is in fact formed by a portion of the substrate 10. A complete support structure may comprise either the first support structure portion 64 or the second support structure portion 66 or both support structure portions 64, 66.

Figure 6D:
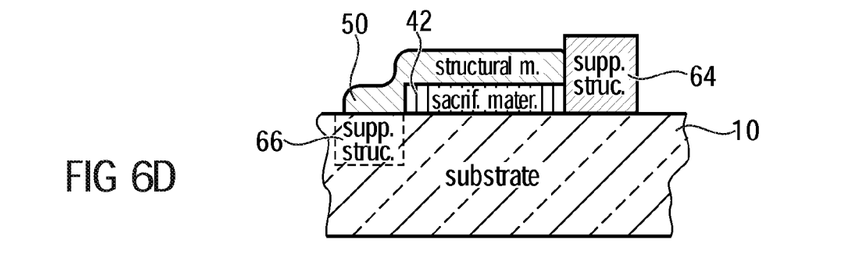

FIG. 6D shows a schematic cross-section of the micromechanical system after a structural material 50 has been deposited and structured. The structural material 50 covers the second support structure portion 66 and the sacrificial layer 42. The structural material 50 is also in lateral contact with the second support structure portion 64.

Figure 6E:
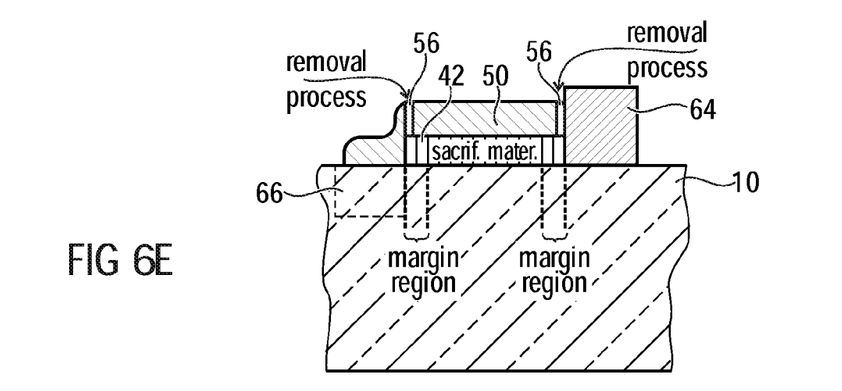

FIG. 6E shows a schematic cross-section of the micromechanical system after two etch holes 56 have been formed in the structural material 50. Typically, at least one etch hole is formed in the structural material 50. The two etch holes 56 extend in a substantially orthogonal direction relative to the surface of the substrate 10. Furthermore, the two etch holes 56 end at a margin region of the sacrificial layer 42. In order to remove the sacrificial layer 42, a removal process acts through the etch holes 56, for example by introducing an etching agent through the etch holes 56. Typically, the etching agent is highly selective to the material of the sacrificial layer 42. For example, the sacrificial layer 42 may be a carbon layer or a layer with a high carbon content (e.g., 80% carbon and more). Exposing the entire micromechanical system to this etching agent typically does not affect (or only to a minor extent) the structural material 50, the support structure portion 64 and the substrate 10.

Figure 6F:
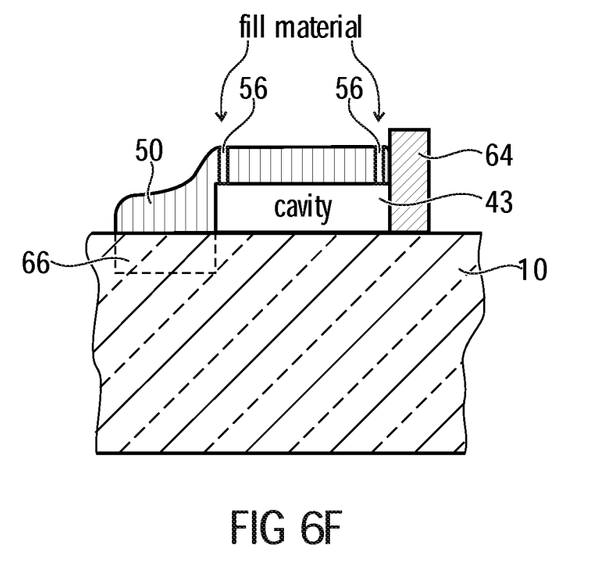

FIG. 6F schematically illustrates the micromechanical system after the sacrificial layer has been removed so that the cavity 43 between the substrate 10, the structural material 50, and also the support structure portion 64 has been obtained. The cavity 43 may now be sealed against a surrounding environment by closing the etch holes 56 with a filling material.

Figure 6G:
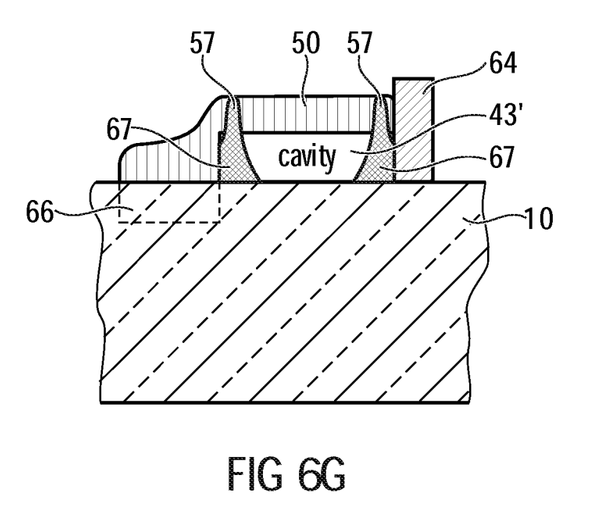

FIG. 6G shows a schematic cross-section of the micromechanical system after the etch holes have been filled with a filling material ("first material") in order to provide filled holes 57. At the same time, pillar-like structures 67 have been formed within the margin region of the cavity directly beneath the filled holes 57. It can be seen that the remaining cavity 43' still has a relatively large clear width. Furthermore, mechanical properties of the structural material 50, such as a bending behavior or a resonance behavior, are not substantially altered or at least not modified too much.

Figure 7:
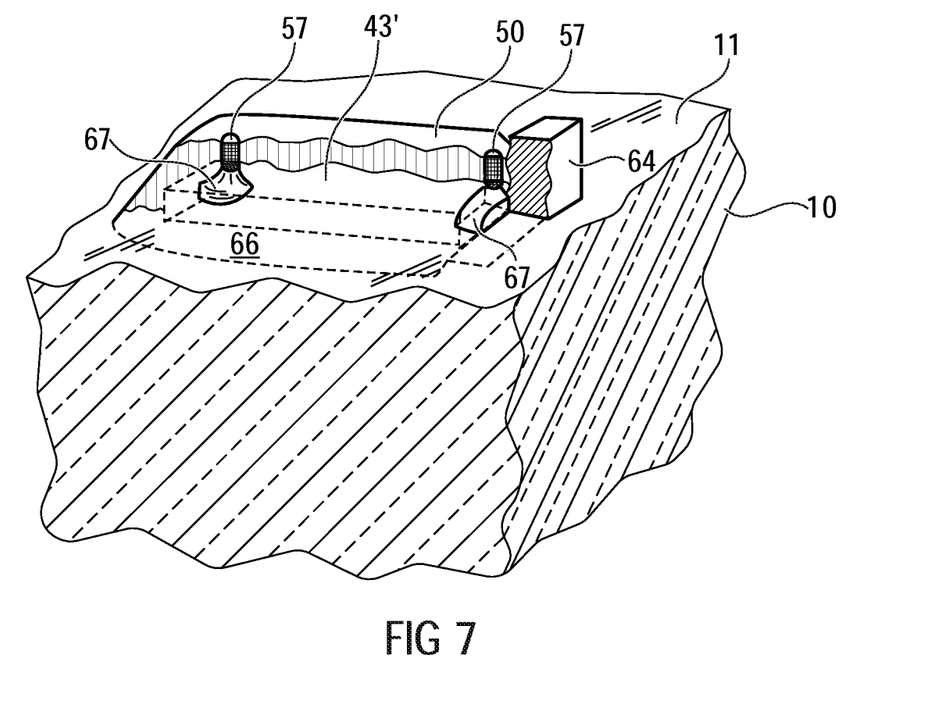
FIG. 7 shows a schematic, perspective breakout view of a micromechanical system during manufacturing, prior to a removal of the sacrificial material.

FIG. 7 shows a schematic, perspective breakout view of a micromechanical systems having a cavity 43' extending between a surface 11 of the substrate 10 and the structural material 50. It can be seen that the pillar-like structures 67 are located beneath the filled holes 57 and do not significantly reduce a volume and/or clear width of the cavity 43' compared to the cavity 43 prior to filling the holes 56. The structural material 50 is shown in a partial sectional view. A dashed line at the surface 11 of the substrate 10 indicates the second support structure portion 66. The extension of the first support structure portion 64 is also indicated by a hatched area at the surface 11 of the substrate 10.

Figure 8:
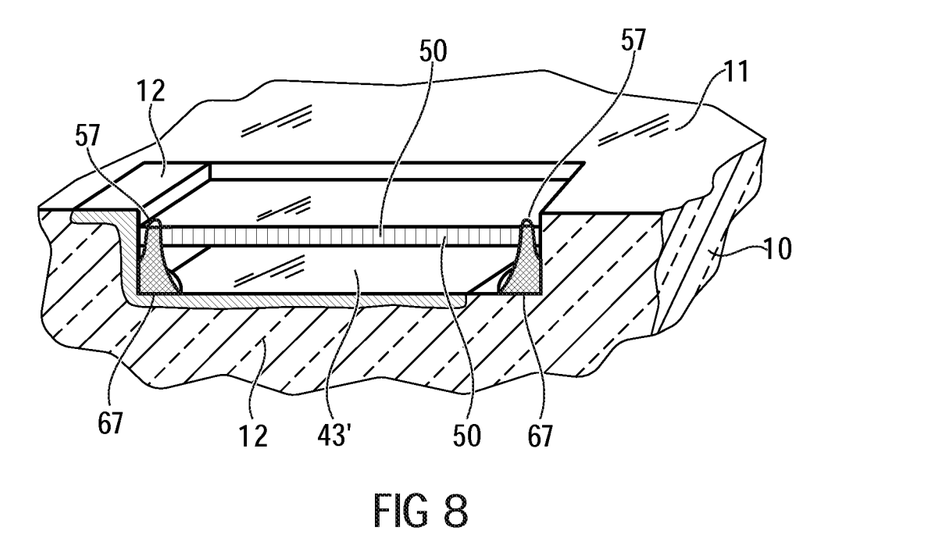
FIG. 8 shows a schematic, perspective breakout view of a micromechanical system.

FIG. 8 shows a schematic, perspective breakout view of a micromechanical system according to further embodiments in which the cavity 43' is formed within the substrate 10 rather than at the surface 11 of the substrate 10. Again it can be seen that the filled holes 57 and the pillars 67 are located in a margin region of the cavity 43'. The margin region of the cavity 43' is indicated in FIG. 8 by a dash-dot-dot line. The doped well 12 is also schematically illustrated in FIG. 8.

Figure 9:
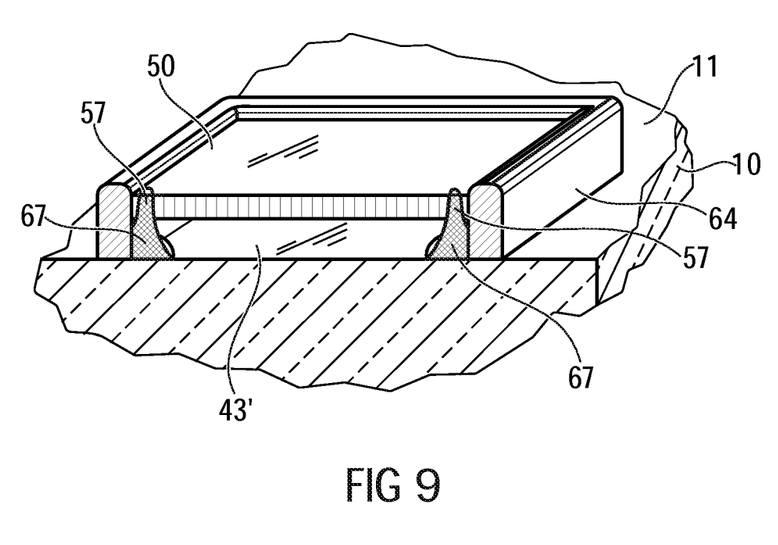
FIG. 9 shows a schematic, perspective breakout view of a micromechanical system in which the structural material is supported by a support structure and extends parallel to and above a surface of a substrate.

FIG. 9 shows a schematic, perspective breakout view of a micromechanical system in which the structural material 50 extends substantially parallel to the surface 11 of the substrate 10 at a certain distance away ("above" in the graphical representation in FIG. 9) from the substrate 10. The support structure 64 is substantially shaped as a rectangular frame. The structural material 50 is mechanically connected to the support structure 64, in particular to inner side walls of the support structure 64. In the alternative, the structural material 50 could be in contact with an upper surface of the support structure 64. The cavity 43' is bounded by the surface 11 of the substrate 10 and by the structural material 50. In a lateral direction the cavity 43' is bounded by the inner side walls of the support structure 64 and by the pillars 67.

The geometrical union of the cavity 43' and the pillars 67 corresponds to a previous cavity 43 which was present between a removal process of a sacrificial material and an act of filling the etch holes 56 in order to obtain filled holes 57. The pillars 67 were formed substantially concurrently with the step of filling the etch holes 56, as illustrated in FIGS. 6F and 6G. Each pillar 67 may be located in a vertex of the geometric union of the cavity and the pillar(s) 67.

The micromechanical systems described above may be used within a microelectromechanical transducer, such as a pressure sensor, a sound transducer, an acceleration sensor, etc. Such a microelectromechanical transducer may comprise a substrate 10 and a cavity 43' formed within or at a surface of the substrate 10. The cavity 43' may be bounded by a bottom and a sidewall. The microelectromechanical transducer may further comprise a support structure 64, 66 that is mechanically connected to the substrate 10. In the alternative, the support structure or a portion of the support structure may be a part of the substrate 10. The microelectromechanical transducer may further comprise a mechanical transducer component 50 which is supported by the support structure 64, 66. The mechanical transducer component has a deflectable portion extending over at least a portion of the cavity. A filled hole 57 is filled with a first material and extends through the mechanical transducer component 50 at a transition from the deflectable portion to a remaining portion (typically: the clamping portion) of the mechanical transducer component. The microelectromechanical transducer further comprises a plug 67 of the first material adjacent to the filled hole 57 at a cavity side end of the filled hole 57 and in contact with at least one of the bottom and the sidewall of the cavity 43'.

Figure 10:
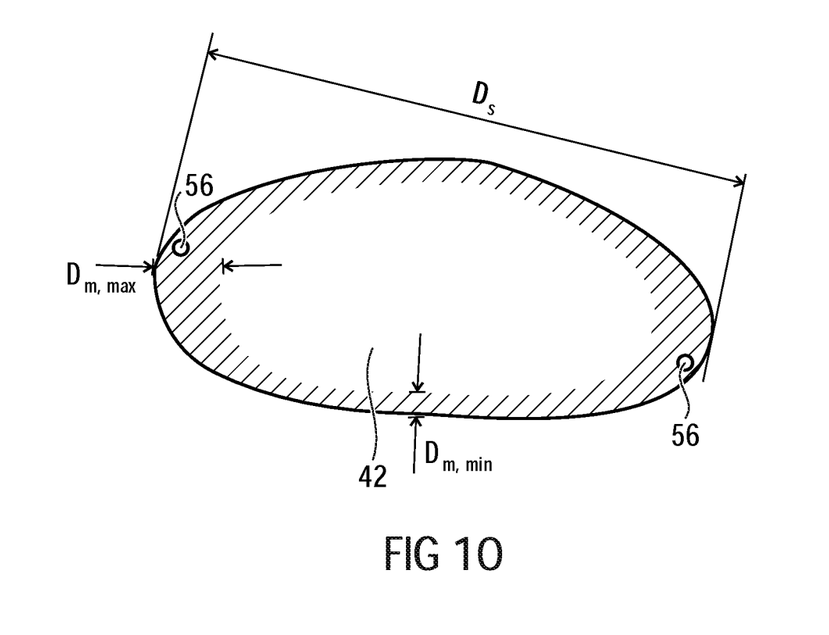
FIG. 10 schematically illustrates a relation between a maximal lateral extension and a margin region of the sacrificial material.

FIG. 10 schematically illustrates a relation between a maximum lateral dimension $D_S$ of the sacrificial material 42 and a width $D_M$ of the margin region of the sacrificial layer 42. The width $D_M$ of the margin region may vary, as illustrated in FIG. 10, between a minimum width $D_{M,min}$ and a maximum width $D_{M,max}$. The margin region has a width equal to the minimum width $D_{M,min}$ where a curvature radius of the edge of the sacrificial layer is large, i.e., where the edge is almost or effectively straight. The margin region has a width equal to the maximum width $D_{M,max}$ where the curvature radius of the edge of the sacrificial layer is small, for example close to a corner (or a rounded corner) of the edge of the sacrificial material. The positions of two etch holes 56 are also schematically illustrated in FIG. 10. In order to provide an example for a condition that the width $D_M$ of the margin region has to fulfill, $D_M$ shall be at most 30% of $D_S$. Alternative choices for $D_M$ are, for example: $D_M \leq 20\%\ D_S$; $D_M \leq 10\%\ D_S$; $D_M \leq 8\%\ D_S$; $D_M \leq 5\%\ D_S$; or $D_M \leq 3\%\ D_S$.

Although some aspects have been described in the context of an apparatus, it is clear that these aspects also represent a description of the corresponding method, where a block or device corresponds to a method act or a feature of a method act. Analogously, aspects described in the context of a method act also represent a description of a corresponding block or item or feature of a corresponding apparatus. Some or all of the method acts may be executed by (or using) a hardware apparatus, like for example, a microprocessor, a programmable computer or an electronic circuit. In some embodiments, some one or more of the most important method acts may be executed by such an apparatus.

In the foregoing Detailed Description, it can be seen that various features are grouped together in embodiments for the purpose of streamlining the disclosure. This method of disclosure is not to be interpreted as reflecting an intention that the claimed embodiments require more features than are expressly recited in each claim. Rather, as the following claims reflect, inventive subject matter may lie in less than all features of a single disclosed embodiment. Thus the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent claim or a combination of each feature with other dependent or independent claims. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective steps of these methods.

Furthermore, in some embodiments a single act may include or may be broken into multiple sub acts. Such sub acts may be included and part of the disclosure of this single act unless explicitly excluded.

The above described embodiments are merely illustrative for the principles of the present disclosure. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

The invention claimed is:

1. A method for manufacturing a micromechanical system, the method comprising:
creating a sacrificial layer at a surface of a substrate;
depositing a structural material at a surface of the sacrificial layer and at a support structure for later supporting the structural material;
creating at least one hole in the structural material extending from an exposed surface of the structural material to the surface of the sacrificial layer, wherein the at least one hole leads to a region close to a lateral boundary of the sacrificial layer;
removing the sacrificial layer using a removal process through the at least one hole, to obtain a cavity between the surface of the substrate and the structural material;
filling the at least one hole and only a portion of the cavity substantially corresponding to a region beneath the at least one hole close to a lateral boundary of the cavity; and
creating a trench within the substrate prior to creating the sacrificial layer so that at least a portion of the sacrificial layer is created at the surface of the substrate within the trench, wherein creating the trench is performed concurrently with a creation of a shallow trench isolation performed on the substrate for isolating electronic components from each other to be formed at or within the substrate at a later time.

2. The method according to claim 1, wherein the sacrificial layer is laterally defined by the lateral boundary and wherein the at least one hole is spaced apart from the lateral boundary in a direction perpendicular to the lateral boundary by at most 30% of a largest lateral extension of the sacrificial layer.

3. The method according to claim 1, wherein the sacrificial layer has a lateral shape with at least one vertex and wherein the at least one hole in the structural material is close to the at least one vertex.

4. The method according to claim 1, wherein the removal process is a wide-ranging process so that the entire sacrificial layer is removed by applying the removal process through the at least one hole that is close to the lateral boundary of the sacrificial layer.

5. The method according to claim 1, wherein the removal process comprises at least one of a thermal decomposition process, a dry etching process, a plasma-assisted etching process, and an ashing process.

6. The method according to claim 1, wherein the sacrificial layer comprises carbon.

7. The method according to claim 1, further comprising:
filling, at least partially, the trench with an oxide between creating the trench and creating the sacrificial layer.

8. The method according to claim 1, further comprising performing a CMOS process after filling the at least one hole.

9. The method according to claim 1, further comprising:
structuring the sacrificial layer.

10. The method according to claim 1, further comprising:
structuring the structural material concurrently with creating the at least one hole.

11. The method according to claim 1, wherein the structural material forms one of a membrane, a beam, a lever, a rotor, a wheel, a connecting rod, and a cantilever of the micromechanical system when finished.

12. The method according to claim 1, wherein the first material used for filling the at least one hole is a shallow trench isolation high density plasma (STI-HDP) oxide.

13. A method for manufacturing a micromechanical system, comprising:
forming a shallow trench within a substrate;
creating at least one of an oxide layer and a nitride layer as an isolation within the shallow trench;
doping at least a portion of the substrate below the shallow trench under the isolation so that the resultant micromechanical system overlies the doped substrate portion within the substrate;
depositing and then structuring a sacrificial layer within the shallow trench over the isolation;
depositing a structural material over the sacrificial layer within the shallow trench;
structuring the structural material and concurrently forming at least one hole in the structural material that is above a lateral edge of the sacrificial layer, the at least one hole giving access to the sacrificial layer;
removing the sacrificial layer by accessing the same through the at least one hole in the structural layer to define a cavity; and
closing the at least one hole and concurrently filling only a relatively small portion of the cavity substantially corresponding to a region beneath the at least one hole with a material that is used for closing the at least one hole, thereby maintaining a major portion of the cavity.

14. A micromechanical system comprising:
a substrate;
a structural material;
a cavity between the substrate and the structural material, wherein the structural material and the cavity are located in a shallow trench isolation structure formed in the substrate;
a filled hole extending through the structural material in a direction perpendicular to a main surface of the substrate at a lateral position just outside the cavity, wherein the filled hole is filled with a first material, wherein the first material used for filling the at least one hole is a shallow trench isolation high density plasma (STI-HDP) oxide; and
a pillar of the first material extending between the filled hole and the substrate and being adjacent to the cavity.

15. The micromechanical system according to claim 14, wherein the structural material forms one of a membrane, a beam, a lever, a wheel, a rotor, a connecting rod, and a cantilever of the micromechanical system.

16. The micromechanical system according to claim 14, wherein the cavity is at least one of gastight and sealed against an environment of the micromechanical system.

17. The micromechanical system according to claim 14, wherein the pillar is located in a vertex of a geometric union of the cavity and the pillar.

18. The micromechanical system according to claim 14, wherein the shallow trench isolation structure is filled with a high density plasma oxide adjacent to the structural material.

19. A microelectromechanical transducer comprising:
a substrate;
a cavity formed within the substrate and bounded by a bottom and a sidewall of the substrate;
a support structure being a part of the substrate;
a mechanical transducer component supported by the support structure and having a deflectable portion extending over at least a portion of the cavity, wherein a filled hole filled with a first material extends through the mechanical transducer component at a transition from the deflectable portion to a remaining portion of the mechanical transducer component, and wherein the first material used for filling the at least one hole is a shallow trench isolation high density plasma (STI-HDP) oxide; and
a plug of the first material substantially below the filled hole within the cavity at a cavity side end thereof and in contact with at least one of the bottom and the sidewall of the substrate, wherein the plug fills only a portion of the cavity substantially corresponding to a region beneath the filled hole, thereby maintaining a major portion of the cavity.

20. A method for manufacturing a micromechanical system, the method comprising:
creating a sacrificial layer at a surface of a substrate;
depositing a structural material at a surface of the sacrificial layer and at a support structure for later supporting the structural material;
creating at least one hole in the structural material extending from an exposed surface of the structural material to the surface of the sacrificial layer, wherein the at least one hole leads to a region close to a lateral boundary of the sacrificial layer;
removing the sacrificial layer using a removal process through the at least one hole, to obtain a cavity between the surface of the substrate and the structural material;
filling the at least one hole and only a portion of the cavity substantially corresponding to a region beneath the at least one hole close to a lateral boundary of the cavity; and creating a trench within the substrate prior to creating the sacrificial layer so that at least a portion of the sacrificial layer is created at the surface of the substrate within the trench, wherein creating the trench is performed together with a creation of a shallow trench isolation performed on the substrate for isolating electronic components from each other to be formed at or within the substrate at a later time.

21. A method for manufacturing a micromechanical system, the method comprising:
creating a sacrificial layer at a surface of a substrate;
depositing a structural material at a surface of the sacrificial layer and at a support structure for later supporting the structural material;
creating at least one hole in the structural material extending from an exposed surface of the structural material to the surface of the sacrificial layer, wherein the at least one hole leads to a region close to a lateral boundary of the sacrificial layer;
removing the sacrificial layer using a removal process through the at least one hole, to obtain a cavity between the surface of the substrate and the structural material; and
filling the at least one hole and only a portion of the cavity substantially corresponding to a region beneath the at least one hole close to a lateral boundary of the cavity, wherein the first material used for filling the at least one hole is a shallow trench isolation high density plasma (STI-HDP) oxide.

* * * * *